United States Patent [19]

Tijburg et al.

[11] 4,224,101

[45] Sep. 23, 1980

[54] METHOD OF MANUFACTURING SEMICONDUCTOR DEVICES USING LASER BEAM CUTTING

[75] Inventors: Rudolf P. Tijburg; Cornelus P. T. M. Damen, both of Eindhoven, Netherlands

[73] Assignee: U.S. Philips Corporation, New York, N.Y.

[21] Appl. No.: 968,643

[22] Filed: Dec. 11, 1978

Related U.S. Application Data

[63] Continuation of Ser. No. 824,504, Aug. 15, 1977, abandoned.

[30] Foreign Application Priority Data

Sep. 3, 1976 [NL] Netherlands ............... 7609815

[51] Int. Cl.² ...................................... H01L 21/306
[52] U.S. Cl. ................................. 156/643; 29/413;
29/583; 156/638; 156/645; 156/655; 156/662;
219/121 LM; 252/79.5
[58] Field of Search ....................... 29/413, 580, 583;
219/121 L, 121 LM; 156/638, 643, 645, 655,
662; 252/79.5

[56] References Cited

U.S. PATENT DOCUMENTS

| 3,112,850 | 12/1963 | Garibotti | 219/121 LM |
|---|---|---|---|
| 3,698,080 | 10/1972 | Berner | 29/583 |
| 3,866,398 | 2/1975 | Vernon et al. | 156/643 |
| 3,867,217 | 2/1975 | Maggs et al. | 156/643 |
| 3,953,919 | 5/1976 | Moore | 29/583 |

FOREIGN PATENT DOCUMENTS 4878331 3/1975 Japan.

OTHER PUBLICATIONS

Applied Physics Letters, vol. 24, No. 6, Mar. 15, 1974, pp. 292–294, Laser-Machined GaP Monolithic Displays by Dapkus et al.

*Primary Examiner*—William A. Powell
*Attorney, Agent, or Firm*—Thomas A. Briody; Robert T. Mayer; Steven R. Biren

[57] ABSTRACT

A method of manufacturing semiconductor devices using laser beam cutting is disclosed in which the surface debris or pollution resulting from the laser beam cutting operation is removed by a preferential etching treatment. Since the polluting particles are of nonmonocrystalline semiconductor material, while the underlying material of the semiconductor disc is monocrystalline in nature, the polluting particles may be selectively removed in an effective manner by preferentially etching the nonmonocrystalline material of the particles with respect to the monocrystalline material of the disc. This preferential etching treatment may advantageously be carried out prior to the severing of the semiconductor disc to form the individual semiconductor devices.

6 Claims, 1 Drawing Figure

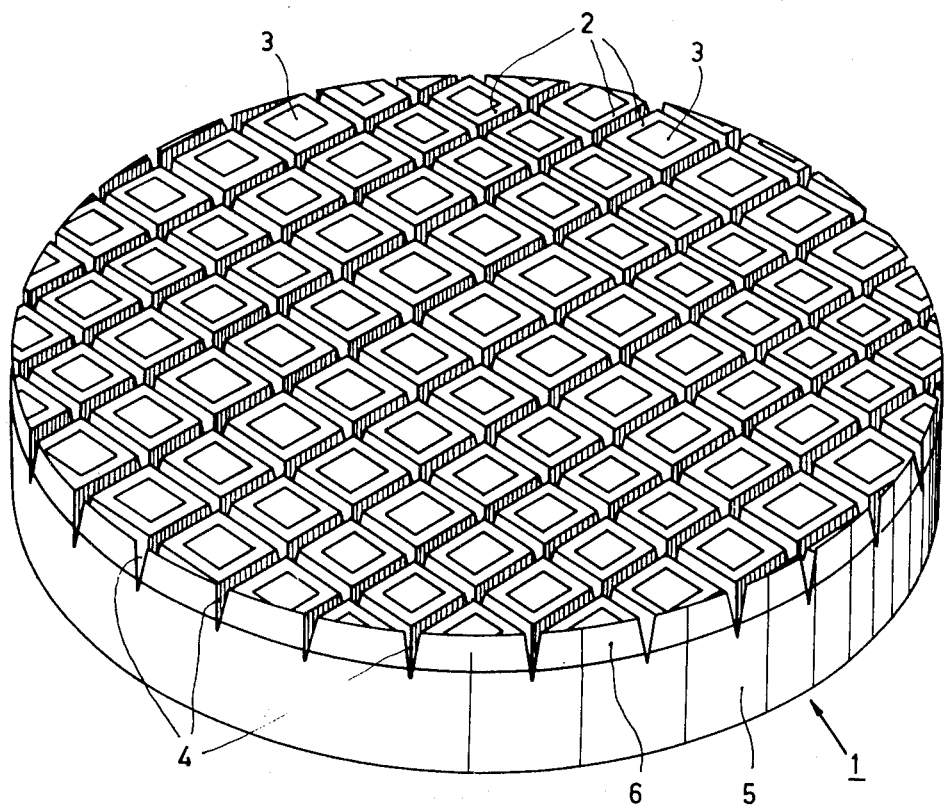

METHOD OF MANUFACTURING SEMICONDUCTOR DEVICES USING LASER BEAM CUTTING

This is a continuation of application Ser. No. 824,504, filed Aug. 15, 1977, now abandoned.

The invention relates to a method of manufacturing semiconductor devices each comprising a semiconductor body having a desired structure in which a disc of semiconductor material is subjected at a major surface to treatments in which a plurality of such desired structures is obtained, after which the disc is severed to semiconductor bodies each having the desired structure by means of laser beam cutting. The invention also relates to a semiconductor device manufactured by means of the method.

Methods of the kind mentioned are conventionally used in manufacturing, for example, transistors, integrated circuits, light-emissive diodes, and so on.

In these methods, the structures essential for the semiconductor devices are simultaneously formed in large numbers in one semiconductor disc. After severing the disc to form the individual semiconductor bodies, said bodies are provided with electrical connections, envelopes, and so on.

Upon laser beam cutting of the disc, the surface of the semiconductor bodies is often polluted with polycrystalline or amorphous particles of semiconductor material having a composition which often differs from that of the material of the disc. Such particles often adhere persistently to the surface and are difficult to remove.

In order to avoid said pollution it is known to provide the semiconductor disc, prior to severing, with a layer of lacquer, so that the particles land on the layer of lacquer, after which they are removed from the semiconductor bodies together with the lacquer layer.

The said use of the lacquer layer requires a number of cumbersome treatments. In addition, stresses, dislocations and the like can often occur at the cutting surfaces by polycrystalline semiconductor material which is formed at the said areas.

One of the objects of the invention is to avoid the said drawbacks of the known method at least to a considerable extent. It is inter alia based on the recognition of the fact that polycrystalline material can be removed from the semiconductor bodies by means of an etching process.

Therefore, according to the invention, the method mentioned above is characterized in that material formed during cutting the disc is preferentially etched away with respect to the semiconductor material.

If the semiconductor body is composed of elementary semiconductor material, the material formed during cutting the disc will have the same composition as the body but will be polycrystalline or have an amorphous character due to the large and rapid temperature changes during the cutting with the laser beam.

Etching is carried out in an etching bath which is suitable for the elementary semiconductor material. The reason of the preferential etching is that generally polycrystalline and amorphous semiconductor material etch more rapidly than does a monocrystalline semiconductor body.

It is to be noted that the laser beam in most of the cases does not cut through the semiconductor disc but forms grooves, after which the severing is completed by breaking.

The etching away of the material formed during cutting is particularly simple when the etching away is carried out prior to the severing of the disc in the semiconductor bodies by breaking.

The method according to the invention is preferably used when the disc consists of compound semiconductor material.

The material formed during cutting then often has a chemical composition which differs from that of the semiconductor disc as a result of a difference in volatility of the components of the compound so that the etchant can be adapted to said different composition.

For example, etching is preferably used after cutting a semiconductor disc from a III–V compound, for example, with a surface layer of gallium arsenide phosphide.

The material formed during cutting has a different ratio of arsenic to phosphorus than that of the material of the disc so that the etchant can more specifically be adjusted to the formed material.

The invention will now be described in greater detail with reference to the accompanying FIGURE and an illustrative embodiment.

The drawing is a diagrammatic perspective view of a disc of semiconductor material in a stage of processing while using the method according to the invention.

In this method, a disc 1 of semiconductor material is subjected at a major surface 2 to treatments in which a plurality of desired structures 3 are obtained.

The disc is then severed to semiconductor bodies each having a desired structure 3 by means of laser beam cutting, in which grooves 4 are obtained, succeeded by breaking.

According to the invention, material formed during cutting the disc is etched away preferentially with respect to the semiconductor material.

Said etching is preferably carried out prior to the severing by breaking the disc 1 into the semiconductor bodies via the grooves 4.

The disc 1 may consist, for example, of a substrate 5 of n-type gallium arsenide having a thickness of 400 $\mu$m and a diameter of 5 cm and an n-type epitaxial layer 6 of gallium arsenide phosphide having the composition $GaAs_{0.6}P_{0.4}$ in which the structures 3, for example p-n junctions, are formed to obtain light-emissive diodes.

Cutting is carried out in a usual manner by means of a neodynium YAG-laser.

As an etching bath to remove polycrystalline material formed during laser cutting is used a bath containing 1 part by volume of 10% by weight NaOH, 1 part by volume of 30% by weight $H_2O_2$ and 2 parts by volume of $H_2O$. The polycrystalline material formed is removed entirely in approximately 30 seconds.

Another suitable etching bath is an aqueous solution of 0.3 mol KI and 0.06 mol $I_2$ per liter with pH=11.

After severing the disc by breaking, the semiconductor bodies can be processed to light-emissive diodes in a usual manner.

It will be obvious that the invention is not restricted to the embodiment described, but that many variations are possible without departing from the scope of this invention.

For example, gallium phosphide or silicon may be used as a semiconductor material.

What is claimed is:

1. A method of manufacturing semiconductor devices, each comprising a semiconductor body having a desired structure, which comprises the steps of:

providing a disc of monocrystalline semiconductor material having a major surface;

forming a plurality of said desired structures in said major surface;

scribing the major surface of the semiconductor disc by laser beam cutting to form grooves between adjacent desired structures, the major surface of the monocrystalline semiconductor disc becoming polluted with particles of nonmonocrystalline semiconductor material during said laser beam cutting;

selectively removing said polluting particles from the major surface of the semiconductor disc by preferentially chemically etching the nonmonocrystalline semiconductor material of the particles with respect to the monocrystalline semiconductor material of the disc; and severing the semiconductor disc by breaking along the scribed grooves to separate the disc into said semiconductor devices.

2. A method of manufacturing semiconductor devices as in claim 1, wherein the step of selectively removing the polluting particles by preferential chemical etching is performed before the semiconductor disc is severed.

3. A method as in claim 1, wherein a disc of compound semiconductor material is provided.

4. A method as in claim 3, wherein a disc of III-V compound semiconductor material is provided.

5. A method as in claim 4, wherein a disc having a gallium arsenide substrate with a gallium arsenide phosphide epitaxial layer formed thereon is provided, and wherein the disc is preferentially chemically etched in an etching bath which comprises sodium hydroxide, hydrogen peroxide and water.

6. A method as in claim 4, wherein a disc having a gallium arsenide substrate with a gallium arsenide phosphide epitaxial layer formed thereon is provided, and wherein the disc is preferentially chemically etched in an etching bath which comprises an aqueous solution of potassium iodide and iodine.

* * * * *